(12) United States Patent
Anma et al.

(10) Patent No.: US 6,599,809 B2
(45) Date of Patent: Jul. 29, 2003

(54) METHOD OF MANUFACTURING SEMICONDUCTOR DEVICE HAVING A MARKING RECESS

(75) Inventors: Masatoshi Anma, Hyogo (JP); Kenichi Ooto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/892,772

(22) Filed: Jun. 28, 2001

(65) Prior Publication Data
US 2002/0072195 A1 Jun. 13, 2002

(30) Foreign Application Priority Data
Dec. 12, 2000 (JP) ......................... 2000-376802

(51) Int. Cl.$^7$ .............................. H01L 21/76
(52) U.S. Cl. ..................................... 438/401
(58) Field of Search ........................... 438/401

(56) References Cited

U.S. PATENT DOCUMENTS 5,578,519 A * 11/1996 Cho ........................... 438/401
6,020,263 A * 2/2000 Shih et al. .................. 216/18
6,133,111 A * 10/2000 Sur et al. .................... 257/797

FOREIGN PATENT DOCUMENTS

| JP | 6-97133 | 4/1994 |
|---|---|---|
| JP | 7-142432 | 6/1995 |
| JP | 62-65346 | 3/1997 |

* cited by examiner

*Primary Examiner*—Jey Tsai
(74) *Attorney, Agent, or Firm*—McDermott, Will & Emery

(57) ABSTRACT

A semiconductor device capable of preventing yield reduction and a method of manufacturing the same can be obtained. The method of manufacturing a semiconductor device including an element formation region arranged on a semiconductor substrate and an external region arranged on the semiconductor substrate and surrounding the element formation region, includes the steps of: providing the external region with an interlayer insulating film having a marking recess; providing a covering film extending from an internal portion of the marking recess to an upper surface of the interlayer insulating film; providing a filling film located on the covering film and filling at least the marking recess; and chemically mechanically polishing and moving the covering film on an upper surface of the interlayer insulating film, with the filing film filling at least the marking recess.

10 Claims, 15 Drawing Sheets

REGION EXTERNAL TO CHIP | ELEMENT FORMATION REGION

REGION EXTERNAL TO CHIP | ELEMENT FORMATION REGION

8 REGION EXTERNAL TO CHIP | 9 ELEMENT FORMATION REGION

REGION EXTERNAL TO CHIP | ELEMENT FORMATION REGION

METHOD OF MANUFACTURING SEMICONDUCTOR DEVICE HAVING A MARKING RECESS

BACKGROUND OF THE INVENTION

1. Field of the Invention

The present invention relates generally to semiconductor devices and methods of manufacturing the same and particularly to semiconductor devices having a marking recess for example for an alignment mark and methods of manufacturing the same.

2. Description of the Background Art

Conventionally, dynamic random access memories (DRAMs) and similar semiconductor devices have an alignment mark, a process management pattern and the like formed for photolithography. Such a mark, a pattern and the like are formed on a semiconductor substrate at a region other than an element formation region provided with a field effect transistor, a capacitor and other similar elements, i.e., an external region. FIGS. 22 and 23 are schematic cross sections for illustrating a method of conventionally manufacturing a semiconductor device, showing a step of loading a tungsten film into a contact hole of an element formation region, with an alignment mark or trench formed in an external region. With reference to FIGS. 22 and 23 a method of conventionally manufacturing a semiconductor device will now be described.

Initially, as shown in FIG. 22, in the element formation region on a semiconductor substrate (not shown) an interconnection 107 is formed and thereon an interlayer insulating film 101 is formed. In interlayer insulating film 101 a contact hole 103 is formed to reach interconnection 107. Furthermore, in an external region or a region other than the element formation region, interlayer insulating film 101 has a marking recess 102 serving as an alignment mark. Marking recess 102 has a width W2 of approximately 1 to 7 μm, which is sufficiently greater than a width W1 of contact hole 103. Then, a barrier metal film 104 is provided to extend from an interior of contact hole 103 to an upper surface of interlayer insulating film 101. Barrier metal film 104 can be formed of a titanium nitride (TiN) film and a titanium (Ti) film provided in layers. Barrier metal film 104 is also provided simultaneously in marking recess 102 of the external region.

Then a tungsten film 105 having a thickness W3 is provided on barrier metal film 104 to fill contact hole 103. Since width W2 of marking recess 102 is much greater than width W1 of contact hole 103, marking recess 102 still has an opening reflecting the geometry of marking recess 102 even after tungsten film 105 is provided. That is, marking recess 102 would never be filled by tungsten film 105. If marking recess 102 serving as an alignment mark is filled with tungsten film 105 then it would not be employed as the alignment mark. As such, tungsten film 105 has a thickness set not to completely fill marking recess 102.

Then a chemical mechanical polishing (CMP) process is employed to remove tungsten film 105 and barrier metal film 104 located on the upper surface of interlayer insulating film 101, to provide a structure as shown in FIG. 23. As shown in the figure, the external region is provided with a pattern 108 for a region external to a chip, formed of marking recess 102, a barrier metal film 104a and a tungsten film 105a to serve as an alignment mark, and the element formation region is provided with a structure 109 therein formed of interconnection 107 and barrier metal and tungsten films 104b and 105b filling contact hole 103.

Then, a film deposition process for forming a structure such as an interconnection positioned on interlayer insulating film 101, a photolithography process employing marking recess 102 as an alignment mark, and other processes are performed to obtain a predetermined semiconductor device.

The above conventional method of manufacturing a semiconductor device, however, is disadvantageous, as described below:

When tungsten film 105 and barrier metal film 104 are chemically mechanically polished on the upper surface of interlayer insulating film 101 and thus removed therefrom, the slurry used in the CMP process is introduced into marking recess 102. Some of such slurry introduced into marking recess 102 can still remain therein even after it has undergone a washing step following the chemically mechanically polishing process. Consequently, as shown in FIG. 24, residual slurry 120 still exists in marking recess 102. Such residual slurry 120 causes a defect of a structure such as an interconnection formed in a subsequent step and hence a defect of the semiconductor device. Note that FIG. 24 is a schematic cross section for illustrating a disadvantage of a conventional semiconductor device.

Furthermore, with reference to FIG. 24, a conventional semiconductor device can have marking recess 102 having a bottom corner excessively etched and thus recessed to form a so-called subtrench 116. If such subtrench 116 is formed then in providing a structure in an overlying layer when the alignment mark corresponding to marking recess 102 is used to align a mask or the like the alignment mark's position can be detected erroneously. Consequently, the structure formed in the overlying layer is offset from a predetermined position (or a structural defect occurs). Such a structural defect results in an operational defect of the semiconductor device and thus reduces the yield thereof.

FIGS. 25 and 26 are schematic cross sections for illustrating another disadvantage of a conventional semiconductor device. As shown in the figures, an external region is provided with a marking recess 119 serving as a pattern for a region external to a chip and having a greater width. As shown in the figures, the semiconductor device is basically similar in structure to the FIG. 23 semiconductor device except that marking recess 119 is greater in width than the FIG. 23 marking recess 102. In the FIGS. 25 and 26 semiconductor devices, marking recess 119 is used as a checking pattern further greater in width than an alignment mark, such as a film-thickness monitoring pattern.

With reference to FIG. 25, interlayer insulating film 101 is provided with marking recess 119 and contact hole 103 and then, as shown in FIG. 22, barrier metal film 104 (FIG. 22) and tungsten film 105 (FIG. 22) are provided. Then, barrier metal film 104 and tungsten film 105 are chemically mechanically polished on an upper surface of interlayer insulating film 101 and thus removed therefrom, when, with marking recess 119 having a large width, an abraser pad being used in the chemically mechanically polishing process contacts tungsten film 105 and barrier metal film 104 located on a bottom surface of marking recess 119 and as a result, as shown in FIG. 25, marking recess 119 would have a bottom portion with tungsten film 105a, barrier metal film 104a and interlayer insulating film 101 abrased and thus removed, as labeled 121.

Furthermore, as shown in FIG. 26, the chemically mechanically polishing process can result in marking recess 119 having an upper portion with tungsten film 105a and barrier metal film 104a abrased and thus removed, as labeled 122.

Marking recess 119 having its internal tungsten film 105a and barrier metal film 104 excessively removed can no longer be used as a film-thickness monitoring pattern. As a result, the film thickness cannot be controlled with high precision, also resulting in a reduction of the product yield.

SUMMARY OF THE INVENTION

The present invention contemplates a semiconductor device capable of preventing yield reduction and a method of manufacturing the same.

The present invention in one aspect provides a method of manufacturing a semiconductor device including an element formation region arranged on a semiconductor substrate and an external region arranged on the semiconductor substrate and surrounding the element formation region, including the steps of: providing in the external region an interlayer insulating film having a marking recess; providing a covering film extending from an internal portion of the marking recess to an upper surface of the interlayer insulating film; providing a filling film located on the covering film and filling at least the marking recess; and chemically mechanically polishing and thus removing the covering film located on the upper surface of the interlayer insulating film, with the filling film filling at least the marking recess.

Thus the covering film can be chemically mechanically polished and thus removed from an upper surface of the interlayer insulating film after the marking recess is filled with a filling film. Thus the marking recess can be internally free from residue for example of slurry used in chemically mechanically polishing the covering film. Thus the semiconductor device can be free from a defect otherwise attributed to residual slurry. Thus a high yield of semiconductor devices can be achieved.

The filling film filling the marking recess before the chemically mechanically polishing (CMP) process is provided, can also prevent the process from damaging the covering film in the marking recess and a sidewall of the marking recess.

In the present method in one aspect the step of providing the filling film may include providing a resin film in the marking recess.

As such, following the CMP process the resin film serving as the filling film can be readily removed for example with an organic solvent.

In the present method in the above one aspect an organic resin film is preferably a resist film.

As such, a conventional resist application equipment such as a spin coater can also be used for applying the filling film to prevent a further hike of the cost of equipment for implementing the present invention.

In the present method in the above one aspect the step of providing the filling film may include filling the marking recess with a spin-on-glass film.

As such, liquid spin-on-glass (SOG) can be applied on a surface of the substrate and thus fill the marking recess and then thermally treated to ensure that the marking recess is filled with an SOG film. This in turn ensures that the marking recess is internally free for example from residual slurry.

In the present method in the above one aspect the step of providing the filling film may include filling the marking recess with an optically opaque film and in the present method in the above one aspect the step of removing the covering film may be followed by the step of partially removing the optically opaque film from an upper portion of the marking recess.

Herein the optically opaque film is a film opaque for an optical system for use in detecting the marking recess (for example for the light of a specific wavelength range for use in detecting an alignment mark corresponding to the marking recess) and it may be transparent for visible light. The opaque filling film can partially remain in the marking recess at a bottom thereof. As such, if the marking recess has a bottom portion having a subtrench or a similar structural defect, the opaque filling film existing at the recess's bottom can prevent later detection of the structural defect. Thus, if the marking recess providing an alignment mark has a bottom portion including a structural defect, the structural defect can be prevented from contributing to erroneous detection of the position of the alignment mark.

In the present method in the above one aspect the optically opaque film is preferably a film formed through a spin-on-glass process and being mixed with a dopant to be opaque.

As such, a film that is optically opaque and fills the marking recess can be readily provided.

In the present method in the above one aspect the step of providing the filling film may include providing a phosphorus-containing, silicon oxide film in the marking recess.

As such, a facility conventionally used for providing a silicon oxide film can also be used to provide the filling film. Thus the present method can be implemented without preparing any additional facility. Thus the semiconductor device can be produced at a reduced cost.

Furthermore, the phosphorus-containing, silicon oxide film can be selectively removed for example through a vapor-phase HF reaction relative to an interlayer insulating film formed for example of silicon oxide film. This can facilitate removing only the filling film formed of the phosphorus-containing silicon oxide film after the CMP process is provided.

In the present method in the above one aspect the step of removing the covering film may be followed by the step of removing an upper surface layer of the interlayer insulating film to allow the covering film in the marking recess to have a portion protruding as seen from an upper surface of the interlayer insulating film.

Thus there can be readily obtained a semiconductor device including the marking recess having an upper portion covered with the covering film having a portion protruding as seen from an upper portion of the interlayer insulating film.

If the marking recess is used to provide an alignment mark and the recess underlies an opaque, overlying interlayer insulating film, a portion of the covering film protruding as seen from an upper surface of the interlayer insulating film can contribute to the formation of a protrusion on an upper surface of the overlying interlayer insulating film at the protruding portion of the covering film. This protrusion on the upper surface of the overlying interlayer insulating film can facilitate detection of the alignment mark. This can in turn reliably prevent erroneous detection of the alignment mark.

In the present method in the above one aspect the step of providing the interlayer insulating film preferably includes the steps of: providing an underlying interlayer insulating film in the external region; providing an overlying interlayer insulating film on the underlying interlayer insulating film; and partially removing the overlying and underlying interlayer insulating films to form the marking recess.

Forming the overlying interlayer insulating film of a material having an etching rate different than the filling film (i.e., a material hardly damaged by etching away and thus removing the filling film from the marking recess), ensures that the overlying interlayer insulating film is free from damage otherwise caused when the filling film is removed from the marking recess after the CMP process is provided. As a result, the covering film located on a sidewall surface of the marking recess can be prevented from having a protrusion, as seen from an upper surface of the interlayer insulating film, that would otherwise be attributed to the interlayer insulating film being partially removed when the filling film is removed.

In the present method in the above one aspect the step of providing the interlayer insulating film may include providing the interlayer insulating film extending to the element formation region. In the present method in the above one aspect the step of providing the covering film may be provided following the step of providing in the element formation region at the interlayer insulating film a recess smaller in width than the marking recess. Furthermore, the step of providing the covering film may include filling the recess with the covering film.

As such in a method of manufacturing a semiconductor device including the step of providing the element formation region with a recess such as a contact hole and providing a covering film to fill the recess the external region can have a marking recess internally completely free of residual slurry after the covering film is chemically mechanically polished and thus partially removed.

In the present method in the above one aspect the marking recess is preferably used to form at least one selected from the group consisting of an alignment mark and a process management pattern.

The alignment mark, the process management pattern and the like are greater in width than the contact hole formed in the element formation region. If in the interlayer insulating film provided for example with an alignment mark the element formation region is provided with a contact hole filled with a covering film corresponding to a conductor film, then the covering film is also introduced into the marking recess, although the covering film is only required to have a thickness sufficient to fill the contact hole and the covering film does not fill the marking recess for example for an alignment mark as the marking recess is greater in width than the contact hole. As such, in a region located over the marking recess the covering film would have an upper surface having a depression geometrically corresponding to the marking recess. As such, when the covering film is chemically mechanically polished and thus removed on an upper surface of the interlayer insulating film, slurry and the like conventionally remains in the marking recess (or in the depression). In contrast, the present invention, with a film filling the marking recess for example for an alignment mark, ensures that such residual slurry is prevented. Thus the present invention can be particularly significantly effective if it is applied to a method of manufacturing a semiconductor device including a marking recess for example for an alignment mark greater in width than an element such as a contact hole formed in an element formation region thereof.

The present invention in another aspect provides a semiconductor device manufactured in the method of manufacturing a semiconductor device, as described in the above one aspect.

This can prevent a reduction in the yield of semiconductor devices that is attributable for example to residual slurry in the marking recess.

The present invention in still another aspect provides a semiconductor device having an element formation region arranged on a semiconductor substrate and an external region arranged on the semiconductor substrate and surrounding the element formation region, including: an interlayer insulating film provided in the external region and having a marking recess; and an optically opaque film arranged at a bottom of the marking recess.

As such, if an alignment mark provided by the marking recess is to be detected and the marking recess has a bottom portion having a structural defect such as a subtrench, the opaque film existing at the recess's bottom can prevent detection of the structural defect. This can in turn prevent the erroneous detection of the position of the alignment mark that is otherwise attributable to such a structure defect.

The present invention in still another aspect provides a semiconductor device having an element formation region provided on a semiconductor substrate and an external region arranged on the semiconductor substrate and surrounding the element formation region, including: an interlayer insulating film located in the external region, having an upper surface and provided with a marking recess having a sidewall; and a covering film provided on the sidewall of the marking recess and partially protruding as seen from the upper surface of the interlayer insulating film.

If in the semiconductor device the marking recess is used to provide an alignment mark and the alignment mark underlies an opaque, overlying interlayer insulating film, a portion of the covering film protruding as seen from an upper surface of the interlayer insulating film can contribute to the formation of a protrusion on an upper surface of the overlying interlayer insulating film at the protruding portion of the covering film. The protrusion on the upper surface of the overlying interlayer insulating film can facilitate detection of the alignment mark. This can in turn reliably prevent erroneous detection of the alignment mark. Thus the semiconductor device can be free from a structural defect attributable to erroneous detection of the alignment mark. Thus yield reduction otherwise attributed to such a structural defect can be prevented.

The present invention in still another aspect provides a semiconductor device having an element formation region arranged on a semiconductor substrate and an external region arranged on the semiconductor substrate and surrounding the element formation region, wherein the external region has a marking recess having a sidewall. The external region also has an underlying interlayer insulating film and an overlying interlayer insulating film overlying the underlying interlayer insulating film. The sidewall of the marking recess includes a surface of the underlying interlayer insulating film and a surface of the overlying interlayer insulating film. Furthermore the semiconductor device in the above, still another aspect includes a covering film provided on the sidewall of the marking recess.

Preferably, the overlying interlayer insulating film is formed of a material having an etching rate different than the filling film (i.e., a material hardly damaged while the filling film is etched away and thus removed from the marking recess). This can reliably prevent the overlying interlayer insulating film from being damaged in the present method of manufacturing a semiconductor device when the filling film is removed from the marking recess after the CMP process is conducted with the marking recess having the filling film therein. As a result, the covering film on a sidewall of the marking recess can be free of a protrusion on an upper surface of the overlying interlayer insulating film that is attributable to the overlying interlayer insulating film being partially removed when the filling film is removed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
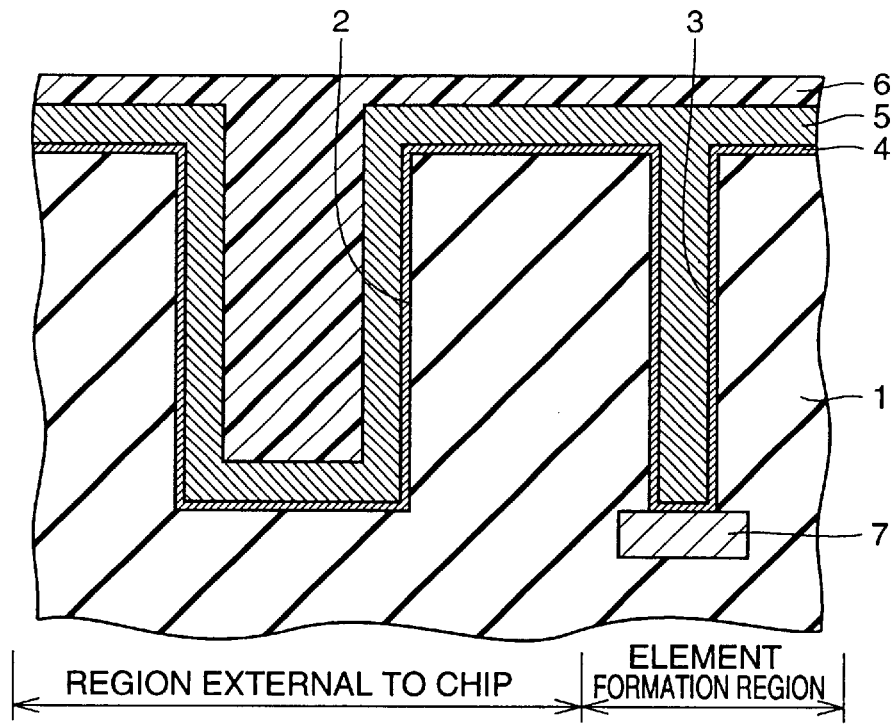
FIGS. 1–3 are schematic cross sections for illustrating first to third steps of a method of manufacturing a semiconductor device in one embodiment of the present invention.

Hereinafter with reference to the drawings the embodiments of the present invention will be described. Note that in the figures, like components are denoted by like reference characters and will thus not be described repeatedly.

First Embodiment

Figure 2:
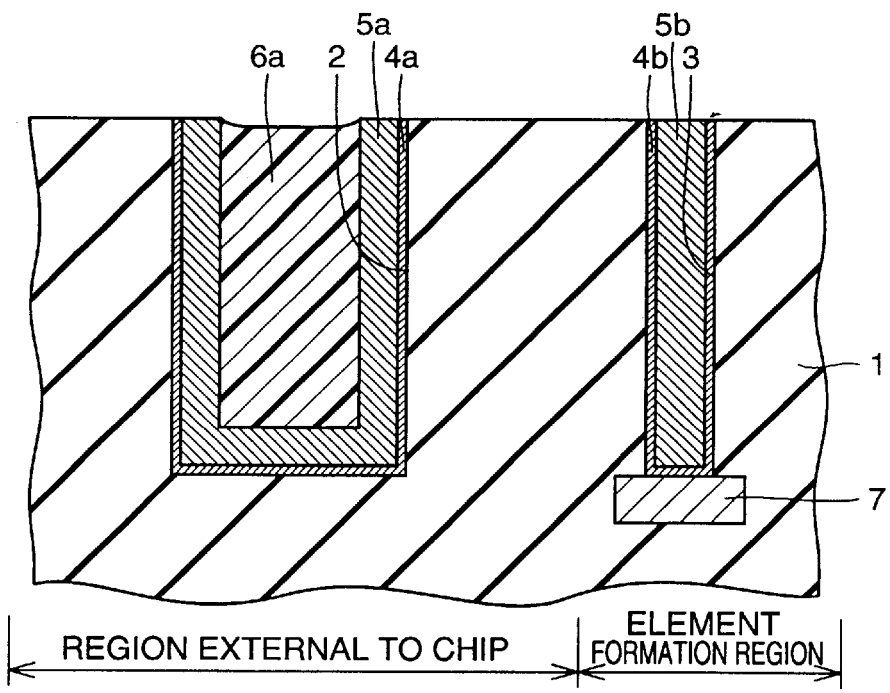
Figure 3:
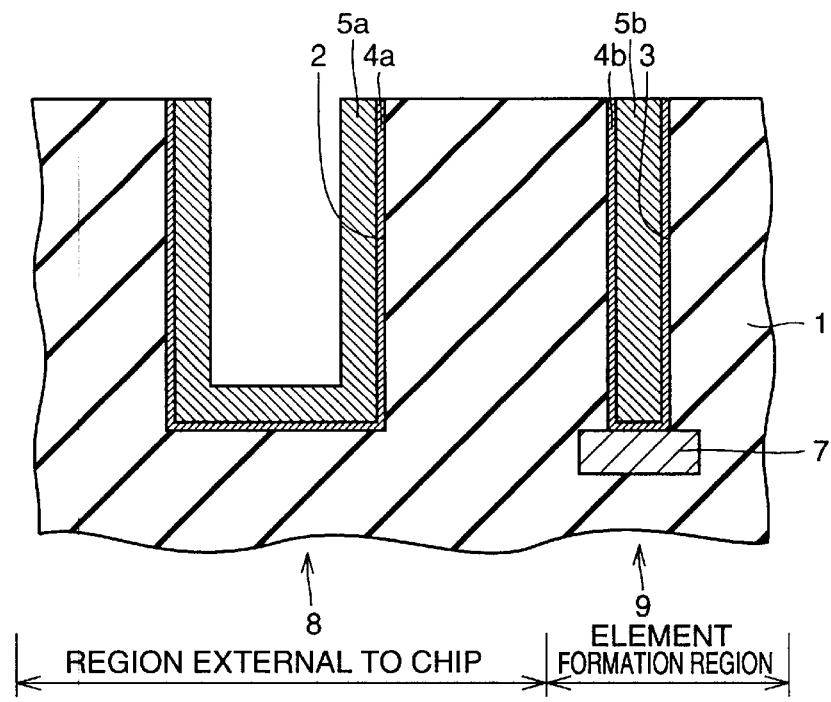
Figure 4:
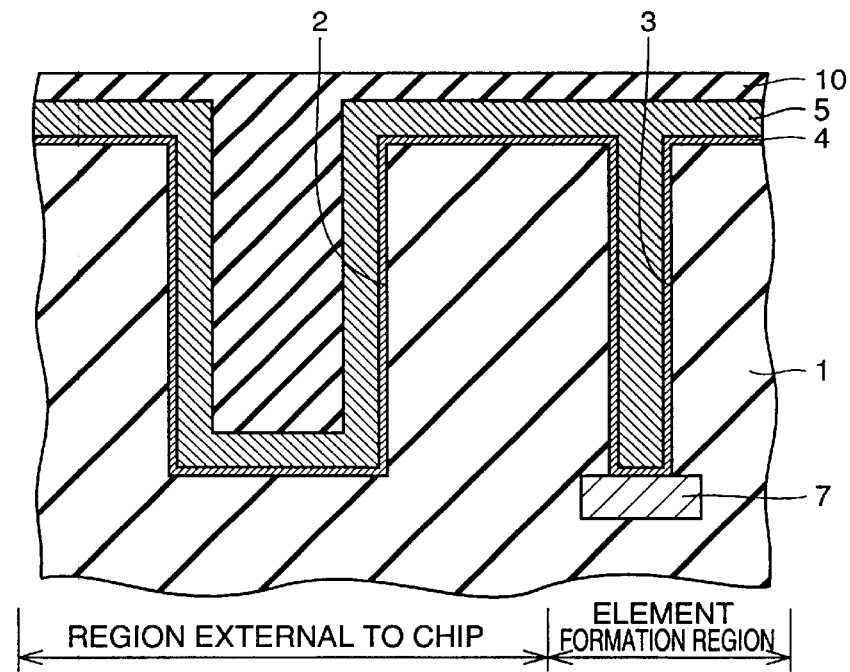
FIGS. 4–7 are schematic cross sections for illustrating first to fourth steps of a method of manufacturing a semiconductor device in a second embodiment of the present invention.

Reference will now be made to FIGS. 1–3 to describe a method of manufacturing a semiconductor device in a first embodiment of the present invention.

Initially, an interconnection 7 (FIG. 1) is provided on a semiconductor substrate (not shown) in an element formation region. An interlayer insulating film 1 (see FIG. 1) is provided on interconnection 7. A resist film (not shown) having a hole pattern is provided on an upper surface of interlayer insulating film 1. The resist film is used as a mask to anisotropically etch a portion of interlayer insulating film 1 away. Thus a contact hole 3 (see FIG. 1) is provided in the form of a recess. Contact hole 3 has a bottom portion exposing an upper surface of interconnection 7.

Furthermore, on the semiconductor substrate in an external region or a region external to a chip a resist film having a hole pattern is provided on an upper surface of interlayer insulating film 1 and the resist film is used as a mask to partially remove interlayer insulating film 1 to provide a trench 2 for a large pattern serving as a marking recess. Then the resist film is removed. Note that contact hole 3 and trench 2 for a large pattern may be formed simultaneously in etching interlayer insulating film 1. The trench 3 for a large pattern is greater in width than contact hole 3 and serves as an alignment mark for a photolithography process, a process management pattern for example for measuring a thickness, and the like.

Then a barrier metal film 4 is provided to extend from an internal portion of trench 2 for a large pattern and that of contact hole 3 to an upper surface of interlayer insulating film 1. Barrier metal film 4 can be a film provided by stacking titanium nitride (TiN) and titanium (Ti). Furthermore, a tungsten film 5 (see FIG. 1) is provided on barrier metal film 4 to fill contact hole 3 as well as extend from an upper surface of interlayer insulating film 1 to an internal portion of trench 2 for a large pattern. Since trench 2 for a large pattern for example for an alignment mark is greater in width than contact hole 3, the trench is not completely filled with tungsten film 5. Then a resist film 6 (see FIG. 1) is provided on tungsten film 5 to fill trench 2 for a large pattern as well as extend to an upper surface of interlayer insulating film 1. Thus a structure as shown in FIG. 1 is obtained.

Then, as shown in FIG. 2, a chemically mechanically polishing process is employed to remove resist film 6, tungsten film 5 and barrier metal film 4 on an upper surface of interlayer insulating film 1 to planarize the upper surface of interlayer insulating film 1. As a result, trench 2 for a large pattern is filled with a barrier metal film 4a, a tungsten film 5a and a resist film 6a. Furthermore in the element formation region contact hole 3 is filled with a barrier metal film 4b and a tungsten film 5b filling contact hole 3.

Thus, in providing an element formation region with a recess serving as contact hole 3 and providing tungsten film 5 to fill contact hole 3 to manufacture a semiconductor device, tungsten film 5, serving as a covering film located on an upper surface of interlayer insulating film 1, is chemically mechanically polished and thus removed after resist film 6 is provided to fill trench 2 for a large pattern serving as a marking recess. This can prevent for example slurry used in the chemically mechanically polishing process from remaining in trench 2 for a large pattern after the films are chemically mechanically polished and removed. As a result, the semiconductor device can be free from a defect attributable to residual slurry, to prevent reduction of the yield of the semiconductor device.

Furthermore, resist film 6 filling trench 2 for a large pattern that is provided before the chemically mechanically polishing process is conducted, can prevent the chemically mechanically polishing process from damaging a wall surface of tungsten film 5, that of barrier metal film 4 and that of trench 2 for a large pattern in trench 2 for a large pattern.

Then, as shown in FIG. 3, resist film 6*a* remaining in trench 2 for a large pattern is removed with a thinner or any other similar organic solvent. Thus a structure as shown in FIG. 3 is obtained.

Thus, the element formation region is provided with a structure internal to the element formation region formed of interconnection 7 and barrier metal film 4*b* and tungsten film 5*b* provided in contact hole 3, and the region external to a chip is provided with a large-sized pattern 8 for the region external to the chip, such as for an alignment mark and a process management mark, corresponding to trench 2 for a large pattern filled with barrier metal film 4*a* and tungsten film 5*a*.

It should be noted that while in the FIGS. 1–3 steps trench 2 for a large pattern is filled with resist film 6 the trench may alternatively be filled with an organic resin that is formed of a material having a viscosity allowing the resin to fill the trench and also allowing the resin applied on a semiconductor wafer to planarize an upper surface of the wafer through its rotation.

In this example, following the chemically mechanically polishing process an organic solvent can be used to readily remove from trench 2 for a large pattern the organic resin serving as a film filling the trench.

Second Embodiment

Reference will now be made to FIGS. 4–7 to describe a method of manufacturing a semiconductor device in a second embodiment of the present invention.

Initially, an interconnection 7, a contact hole 3, a trench 2 for a large pattern, a barrier metal film 4 and a tungsten film 5 (see FIG. 4) are provided on a semiconductor substrate, as described in the method of manufacturing a semiconductor device in the first embodiment. Then, spin-on-glass (SOG) is applied to fill trench 2 for a large pattern as well as extend to an upper surface of interlayer insulating film 1. Then, a thermal treatment in a range of 100° C. to 500° C. is conducted to heat and thus eliminate an excessive amount of an organic solvent in the SOG to provide an SOG film 10 (see FIG. 4).

Then the FIG. 2 step is applied to chemically mechanically polish and thus remove SOG film 10, tungsten film 5 and barrier metal film 4 on an upper surface of interlayer insulating film 1. Thus the structure as shown in FIG. 5 is obtained.

The SOG applied can fill trench 2 for a large pattern. This ensures that trench 2 for a large pattern is filled with SOG film 10. This in turn ensures that trench 2 for a large pattern is internally free from residual slurry.

Figure 5:
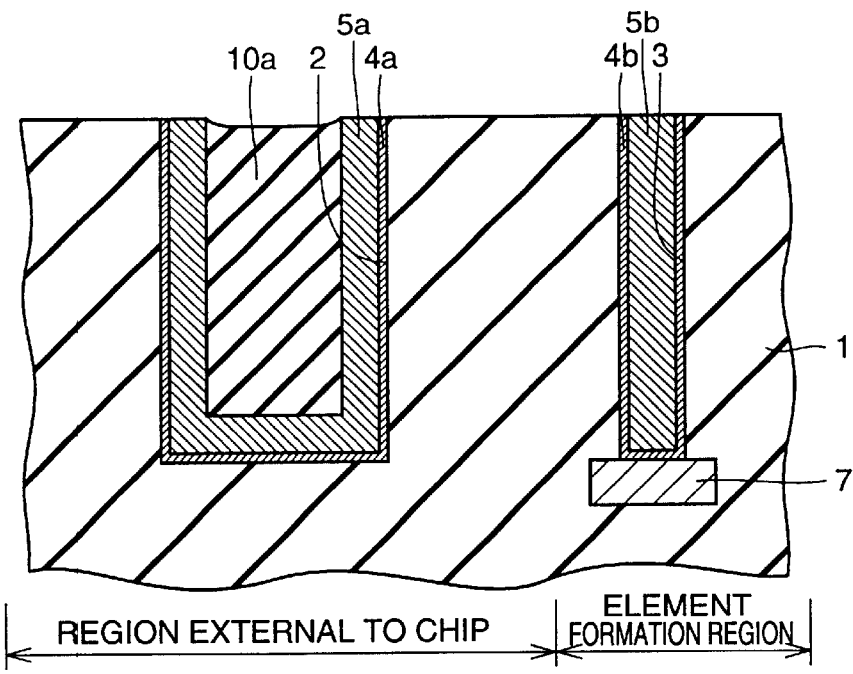

With reference to FIG. 5, contact hole 3 is filled with barrier metal film 4*b* and tungsten film 5*b* filling contact hole 3. Furthermore, trench 2 for a large pattern is filled with barrier metal film 4*a*, tungsten film 5*a*, and SOG film 10*a* provided on tungsten film 5*a* and filling trench 2 for a large pattern.

Figure 6:
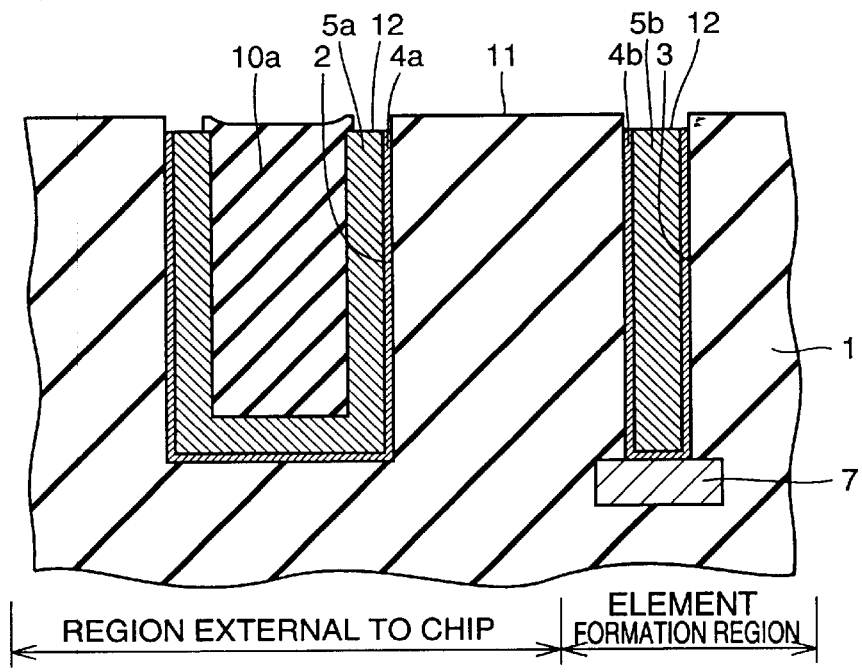

Then, with reference to FIG. 6, tungsten films 5*a* and 5*b* and barrier metal films 4*a* and 4*b* are partially removed, e.g., wet-etched with a reagent. Thus, tungsten films 5*a* and 5*b* and barrier metal films 4*a* and 4*b* have an upper surface 12 lower in level than an upper surface 11 of interlayer insulating film 1.

Figure 7:
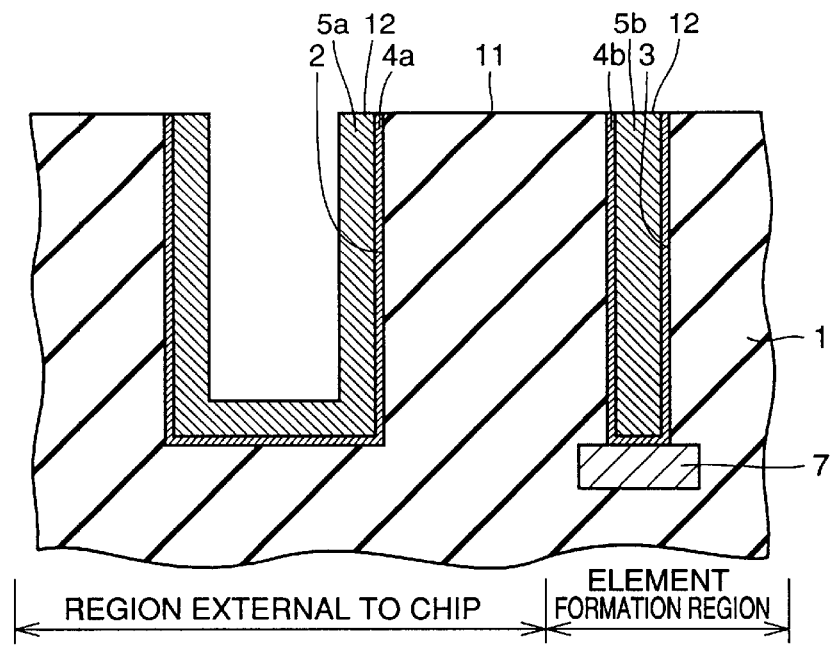

Then, with reference to FIG. 7, SOG film 10*a* in trench 2 for a large pattern is for example wet-etched and thus removed. In thus removing SOG film 10*a*, interlayer insulating film 1 also has its upper surface simultaneously, partially removed. By adjusting the level of the FIG. 6 upper surface 12 of barrier metal films 4*a* and 4*b* and tungsten films 5*a* and 5*b* that should be lowered (or by previously adjusting the level of upper surface 12 that should be lowered in the FIG. 6 step to correspond to the thickness of interlayer insulating film 10 removed in wet etching and thus removing SOG film 10*a*), the SOG film 10*a* removal step, also partially removing an upper surface of interlayer insulating film 1, allows upper surface 11 of interlayer insulating film 1 and upper surface 12 of barrier metal films 4*a* and 4*b* and tungsten films 5*a* and 5*b* to be positionally, substantially matched with each other.

Note that rather than previously partially removing tungsten films 5*a* and 5*b* and barrier metal films 4*a* and 4*b* while allowing for the level of interlayer insulating film 1 that should be lowered before SOG film 10*a* is removed, as described above, a condition for wet-etching and thus removing SOG film 10*a* may be adjusted to allow interlayer insulating film 1 and barrier metal films 4*a* and 4*b* and tungsten films 5*a* and 5*b* to be similarly, partially removed. In this example also the structure as shown in FIG. 7 can be obtained by etching interlayer insulating film 1 and barrier metal films 4*a* and 4*b* and tungsten films 5*a* and 5*b* at a substantially uniform rate.

Third Embodiment

Figure 8:
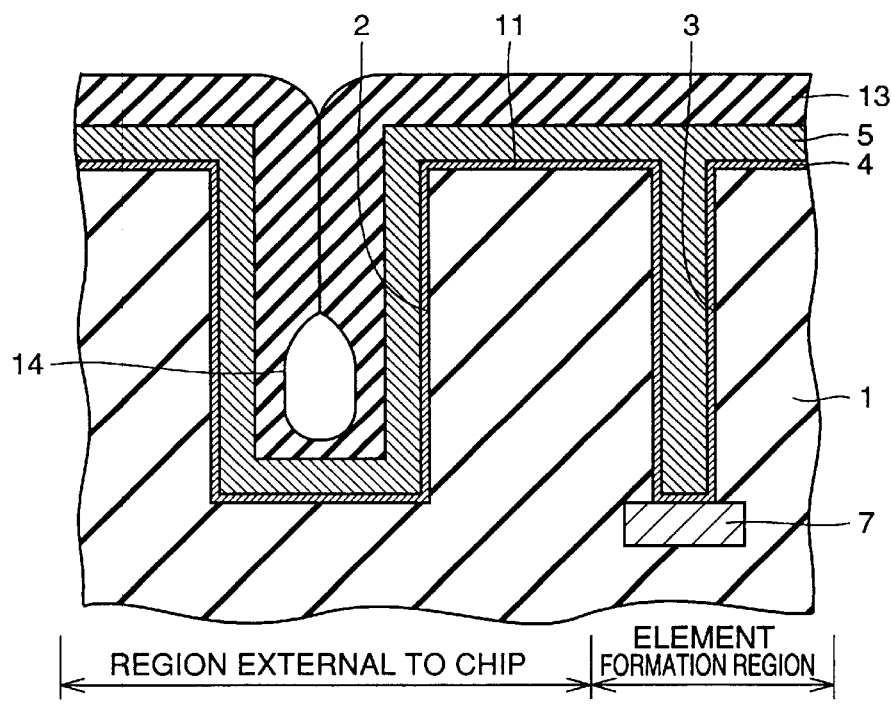
FIGS. 8 and 9 are schematic cross sections for illustrating first and second steps of a method of manufacturing a semiconductor device in a third embodiment of the present invention.
Figure 9:
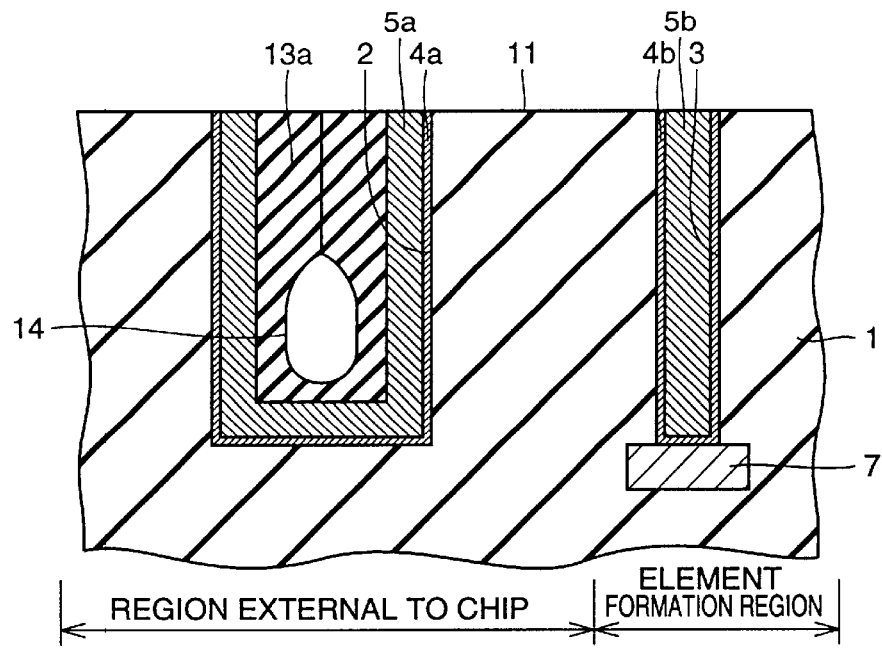

Reference will now be made to FIGS. 8 and 9 to describe a method of manufacturing a semiconductor device in a third embodiment of the present invention.

Initially, an interconnection 7, an interlayer insulating film 1, a contact hole 3, a trench 2 for a large pattern, a barrier metal film 4 and a tungsten film 5 (see FIG. 8) are provided, as described with reference to the FIG. 1 step of the method of manufacturing a semiconductor device in the first embodiment. Then a silicon oxide film 13 containing phosphorus (hereinafter referred to as a PSG film) is provided to fill trench 2 for a large pattern as well as extend to an upper surface of interlayer insulating film 1. Although the provision of PSG film 13 may result in trench 2 for a large pattern having a space 14 therein, if space 14 is positionally lower in level than upper surface 11 of interlayer insulating film 1 the method of the present embodiment can be as effective as the method of the first embodiment.

Then, with reference to FIG. 9, PSG film 13, barrier metal film 4 and tungsten film 5 are chemically mechanically polished and thus removed on an upper surface of interlayer insulating film 1. Thus, contact hole 3 is filled with barrier metal film 4*b* and tungsten film 5*b*. Furthermore, trench 2 for a large pattern is filled with barrier metal film 4*a*, tungsten film 5*a* and PSG film 13*a*.

Then a step similar to the FIG. 3 step is employed to remove PSG film 13*a* in trench 2 for a large pattern to obtain a semiconductor device similar in structure to the FIG. 3 semiconductor device. Note that PSG film 13*a* can be removed through a vapor-phase HF reaction.

As such, equipment conventionally used for providing a silicon oxide film can also be used in providing a PSG film serving as a filling film. This can eliminate the necessity of preparing additional equipment to implement the method of manufacturing a semiconductor device in accordance with the present invention. Thus the semiconductor device can be produced at a reduced cost.

Fourth Embodiment

Figure 10:
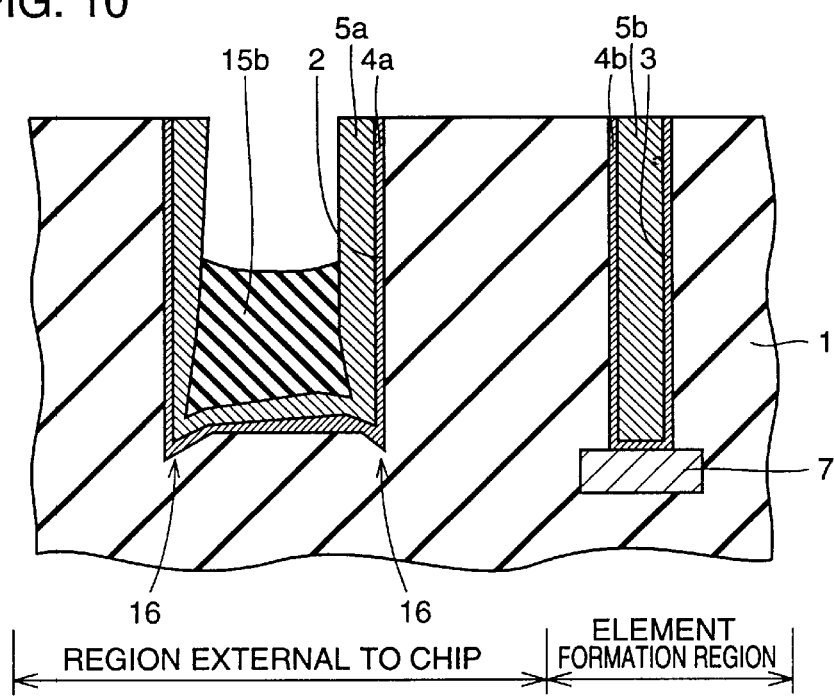
FIG. 10 is a schematic cross section showing a semiconductor device in a fourth embodiment of the present invention.

Reference will now be made to FIG. 10 to describe a semiconductor device in a fourth embodiment of the present invention.

With reference to FIG. 10, the semiconductor device is basically similar in structure to the FIG. 3 semiconductor device of the first embodiment. More specifically, in an element formation region on a semiconductor substrate (not shown) an interconnection 7 is provided and thereon an interlayer insulating film 1 is provided. In interlayer insulating film 1 at a region located on interconnection 7 a contact hole 3 is formed and therein a barrier metal film 4b is provided. On barrier metal film 4b a tungsten film 5b is provided to fill contact hole 3.

In a region external to a chip on the semiconductor substrate interlayer insulating film 1 is provided with a trench 2 for a large pattern serving for example as an alignment mark, a process management pattern for measuring a thickness, and the like. Trench 2 for a large pattern is internally provided with a barrier metal film 4a. On barrier metal film 4a, a tungsten film 5a is provided. Furthermore, a trench 2 for a large pattern has a bottom portion provided with a residual, opaque SOG film 15b.

As such, if in detecting an alignment mark corresponding to trench 2 for a large pattern the trench has a bottom portion having a structural defect such as subtrench 16, the residual, opaque SOG film 15b existing at the bottom portion of the trench can prevent subtrench 16 from being detected as a structural defect. Thus, erroneous detection in position of an alignment mark that is attributable to subtrench 16, can be prevented.

Figure 11:
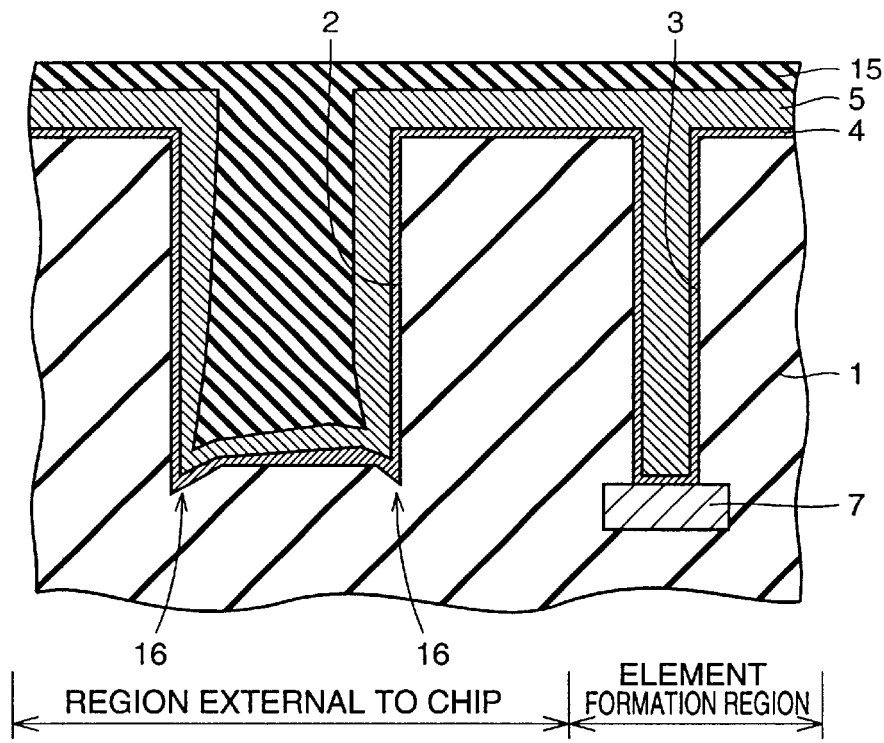
FIGS. 11 and 12 are schematic cross sections for illustrating first and second steps of a method of manufacturing the semiconductor device shown in FIG. 10.
Figure 12:
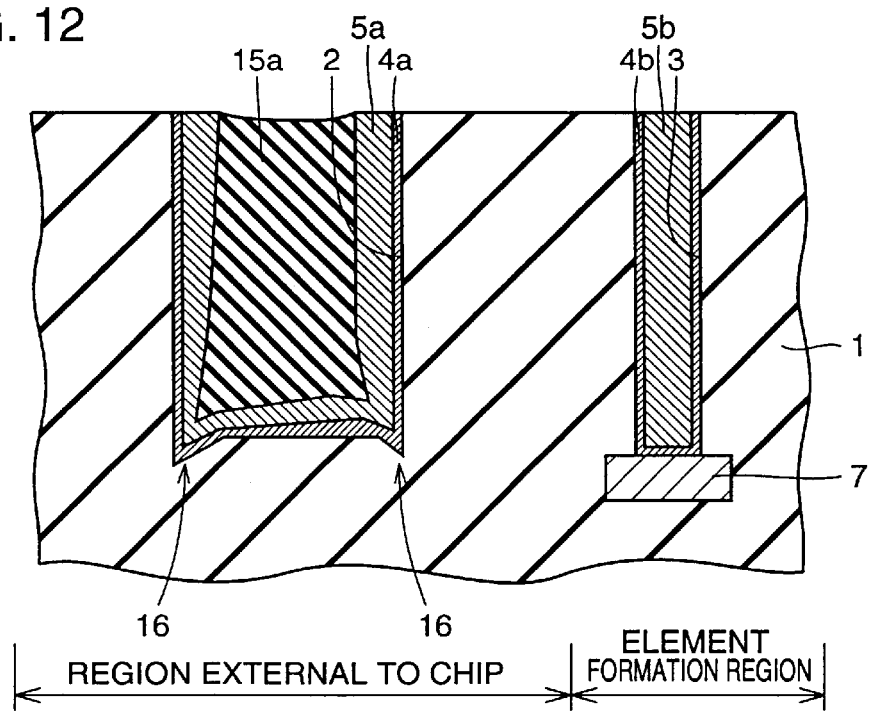

Reference will now be made to FIGS. 11 and 12 to describe a method of manufacturing the semiconductor device shown in FIG. 10.

Initially, on a semiconductor substrate (not shown) an interconnection 7, an interlayer insulating film 1, a contact hole 3, a trench 2 for a large pattern, a barrier metal film 4 and a tungsten film 5 (see FIG. 11) are provided, as described in the method of manufacturing a semiconductor device in the first embodiment. Then, an opaque SOG film 15 (see FIG. 11) is provided to fill trench 2 for a large pattern as well as extend to an upper surface of interlayer insulating film 1. Thus the structure as shown in FIG. 11 is obtained. It should be noted that opaque SOG film 15 can be an SOG film obtained by applying on tungsten film 5 an SOG containing an optically opaque dopant such as powder of a metal such as titanium, and then baking the same to heat and thus eliminate an excessive amount of an organic solvent.

Then, a step similar to the FIG. 2 step is applied to chemically mechanically polish and thus remove opaque SOG film 15, tungsten film 5 and barrier metal film 4 on an upper surface of interlayer insulating film 1. As a result, as shown in FIG. 12, contact hole 3 is filled with barrier metal film 4b and tungsten film 5b. Furthermore, trench 2 for a large pattern is filled with barrier metal film 4a, tungsten film 5a and opaque SOG film 15a.

Then, opaque SOG film 15a is dry-etched and thus partially removed from an upper portion of trench 2 for a large pattern to obtain the semiconductor device as shown in FIG. 10.

Thus, residual, opaque SOG film 15b can exist to readily provide a semiconductor device capable of preventing detection of subtrench 16 located at a bottom portion of trench 2 for a large pattern. Furthermore, using opaque SOG film 15a to fill trench 2 for a large pattern can provide an effect similar to that of the second embodiment.

Fifth Embodiment

Figure 13:
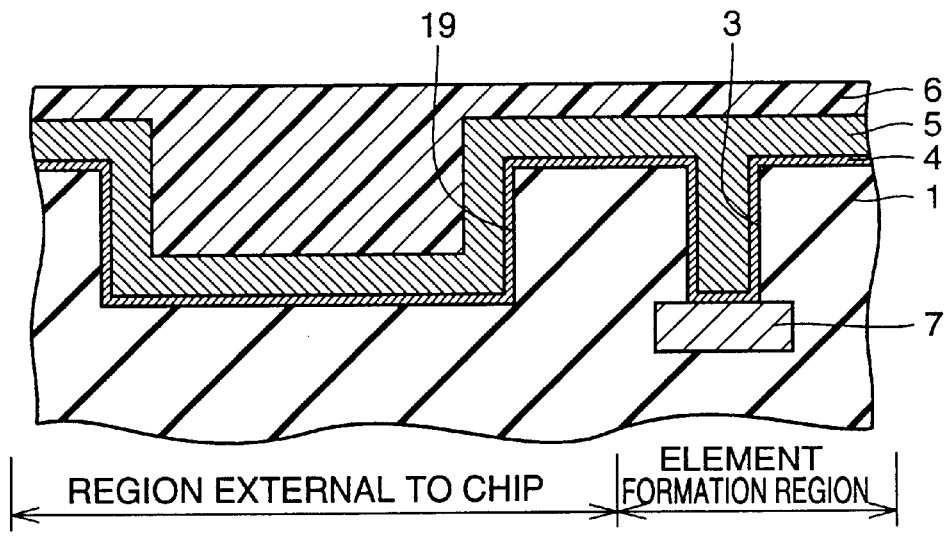
FIGS. 13–15 are schematic cross sections for illustrating first to third steps of a method of manufacturing a semiconductor device in a fifth embodiment of the present invention.
Figure 14:
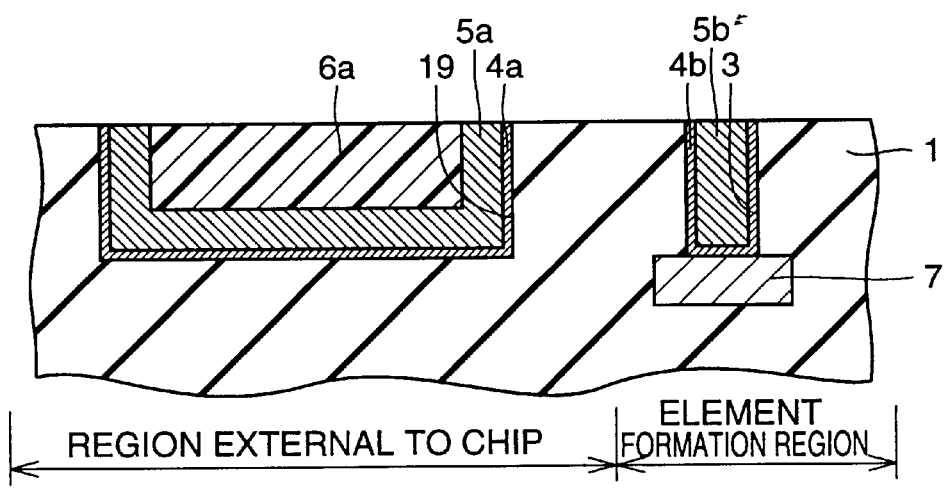
Figure 15:
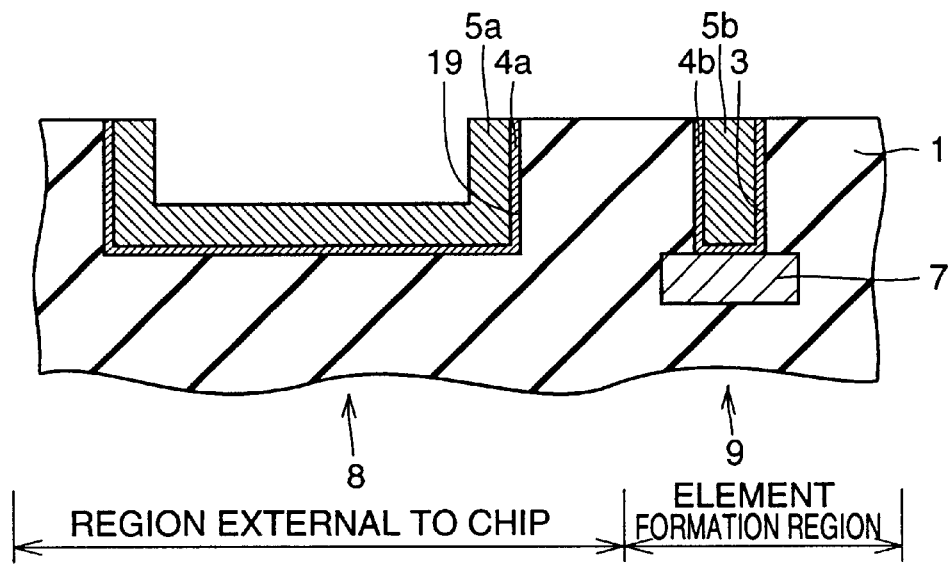

Reference will now be made to FIGS. 13–15 to describe a method of manufacturing a semiconductor device in a fifth embodiment of the present invention.

Initially, in an element formation region on a semiconductor substrate (not shown) an interconnection 7 is provided, as described in the FIG. 1 step of the method of manufacturing a semiconductor device in the first embodiment. On interconnection 7 an interlayer insulating film 1 is provided. Interlayer insulating film 1 is provided with a contact hole 3. Furthermore, in a region external to a chip, interlayer insulating film 1 has a trench 19 for a pattern corresponding to a patterned trench for monitoring a film thickness, provided in the form of a recess for a pattern and greater in width for example than an alignment mark. A barrier metal film 4 is provided to extend from an internal portion of patterned trench 19 and that of contact hole 3 to an upper portion of interlayer insulating film 1. Barrier metal film 4 is covered with tungsten film 5 filling contact hole 3. Furthermore, a resist film 6 is provided to fill trench 19 for a pattern as well as extend to an upper surface of interlayer insulating film 1. Thus the structure as shown in FIG. 13 is obtained.

Then a step similar to the FIG. 2 step is applied to chemically mechanically polish and thus remove resist film 6, tungsten film 5 and barrier metal film 4 on an upper surface of interlayer insulating film 1. Thus, contact hole 3 is filled with barrier metal film 4b and tungsten film 5b and trench 19 for a pattern is filled with barrier metal film 4a, tungsten film 5a and resist film 6a.

Then, a step similar to the FIG. 3 step is applied to remove resist film 6a for example with an organic solvent. Thus the structure as shown in FIG. 15 is obtained.

Thus, if a semiconductor device includes a pattern 8 for a region external to a chip, such as a film-thickness monitoring pattern, and a structure 9 provided in an element formation region, such as interconnection 7 and barrier metal and tungsten films 4b, 5b provided in contact hole 3, pattern 8 for a region external to a chip is not damaged by chemically mechanically polishing and thus partially removing tungsten film 5 and barrier metal film 4, as similarly as in the first embodiment.

Sixth Embodiment

Figure 16:
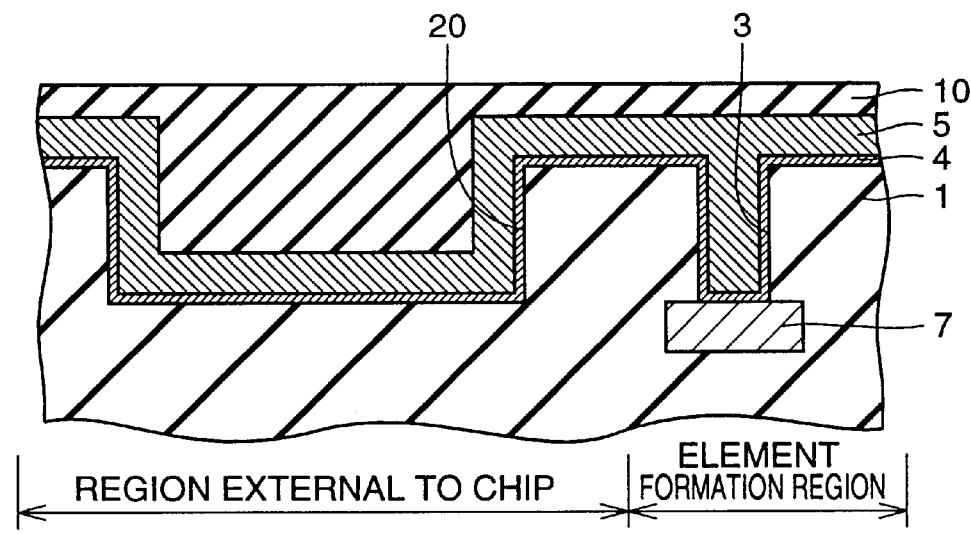
FIG. 16 is a schematic cross section for illustrating a method of manufacturing a semiconductor device in a sixth embodiment of the present invention.

Reference will now be made to FIG. 16 to describe a method of manufacturing a semiconductor device in a sixth embodiment of the present invention.

The FIG. 16 step is basically similar to the FIG. 13 step except that in a region external to a chip at an interlayer insulating film 1 is provided a trench 20 for an alignment mark greater in width than trench 2 for a large pattern.

Furthermore, an SOG film 10 is provided on a tungsten film 5 to fill trench 20 for an alignment mark. SOG film 10 is provided basically as in the process for providing an SOG film in the method of manufacturing a semiconductor device in the second embodiment. The FIG. 16 step can be followed by steps similar to the FIGS. 5–7 steps to readily obtain a semiconductor device having an alignment mark in a region external to a chip. Thus the present embodiment can provide an effect similar to that of the method of manufacturing a semiconductor device in the second embodiment.

Seventh Embodiment

Reference will be made to FIG. 7 to describe a semiconductor device in a seventh embodiment of the present invention.

Figure 17:
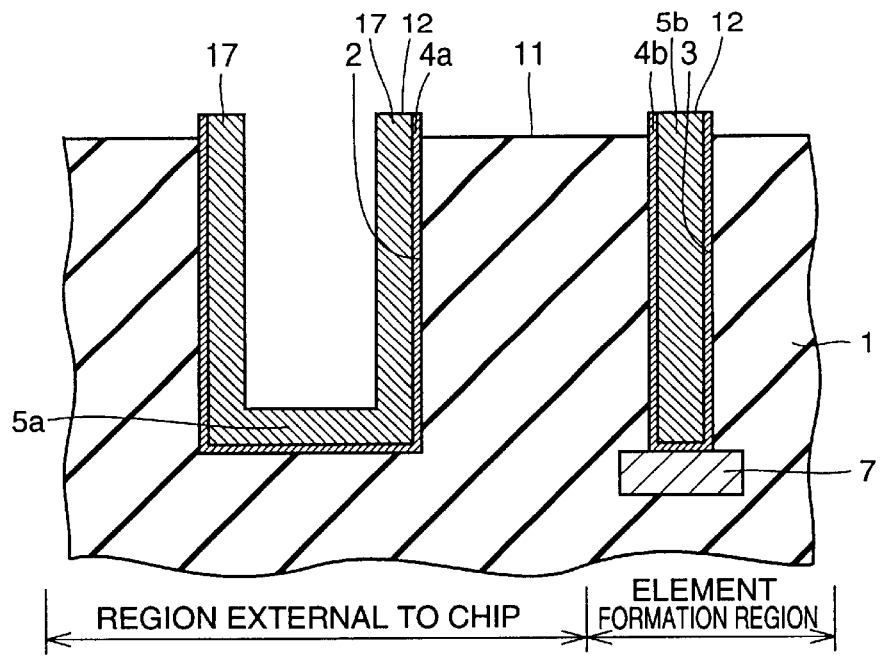
FIG. 17 is a schematic cross section showing a semiconductor device in a seventh embodiment of the present invention.

As shown in FIG. 17, the semiconductor device is similar in structure to that of the first embodiment, except that in the FIG. 17 semiconductor device an interlayer insulating film 1 has an upper surface 11 lower in level than an upper surface 12 of barrier metal films 4a and 4b and tungsten films 5a and 5b. As a result, a trench 2 for a large pattern serving as an alignment mark has an upper portion including a protrusion 17 formed of a portion of barrier metal film 4a and that of tungsten film 5a.

As such, if an alignment mark provided by trench 2 for a large pattern is provided thereon for example with an opaque, overlying interlayer insulating film, the overlying interlayer insulating film also has an upper surface having a protrusion corresponding to protrusion 17, attributed to protrusion 17. The protrusion on the upper surface of the overlying interlayer insulating film can facilitate detection of the alignment mark.

Figure 18:
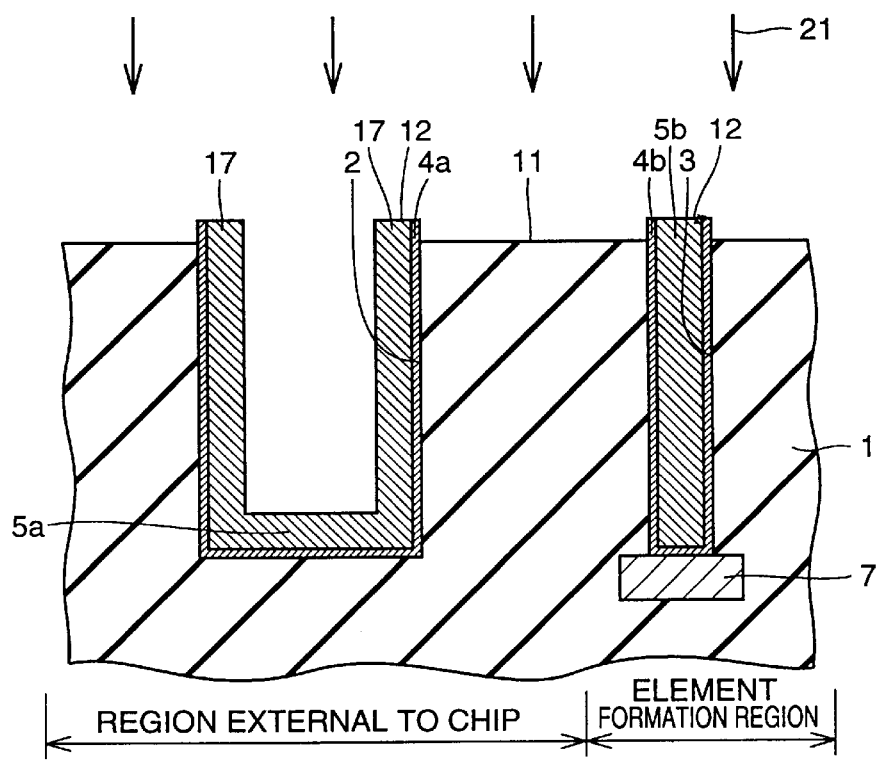
FIG. 18 is a schematic cross section for illustrating a method of manufacturing the semiconductor device shown in FIG. 17.

Reference will be made to FIG. 18 to describe a method of manufacturing the FIG. 17 semiconductor device.

Initially, the FIGS. 1–3 steps are provided. Then, an etchant gas 21 for vapor-phase HF etching is used to etch away a portion of an upper surface of interlayer insulating film 1. As a result, as shown in FIG. 17, interlayer insulating film 1 can have upper surface 11 lower in level than upper surface 12 of barrier metal films 4a and 4b and tungsten films 5a and 5b. Thus the FIG. 17 semiconductor device can be readily obtained.

Eighth Embodiment

Figure 19:
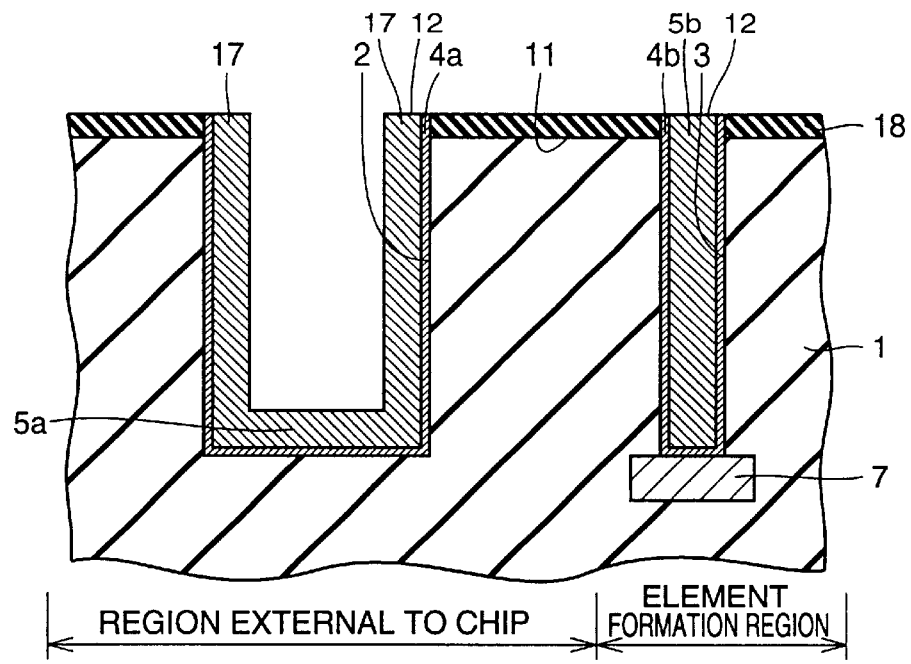
FIG. 19 is a schematic cross section showing a semiconductor device in an eighth embodiment of the present invention.

Reference will now be made to FIG. 19 to describe a semiconductor device in an eighth embodiment of the present invention.

The FIG. 19 semiconductor device is basically similar in structure to the semiconductor device in the first embodiment, except that an interlayer insulating film 1 serving as an underlying interlayer insulating film has an upper surface 11 underlying an overlying interlayer insulating film 18 different in material from interlayer insulating film 1. Overlying interlayer insulating film 18 has an upper surface substantially level with an upper surface 12 of tungsten films 5a and 5b and barrier metal films 4a and 4b.

Figure 20:
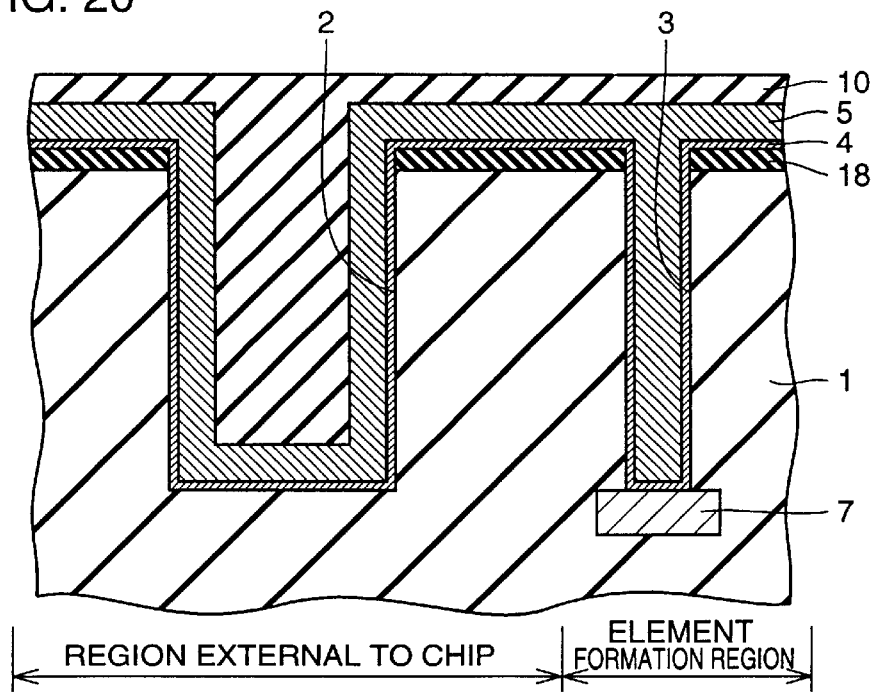
FIGS. 20 and 21 are schematic cross sections for illustrating first and second steps of a method of manufacturing the semiconductor device shown in FIG. 19.
Figure 21:
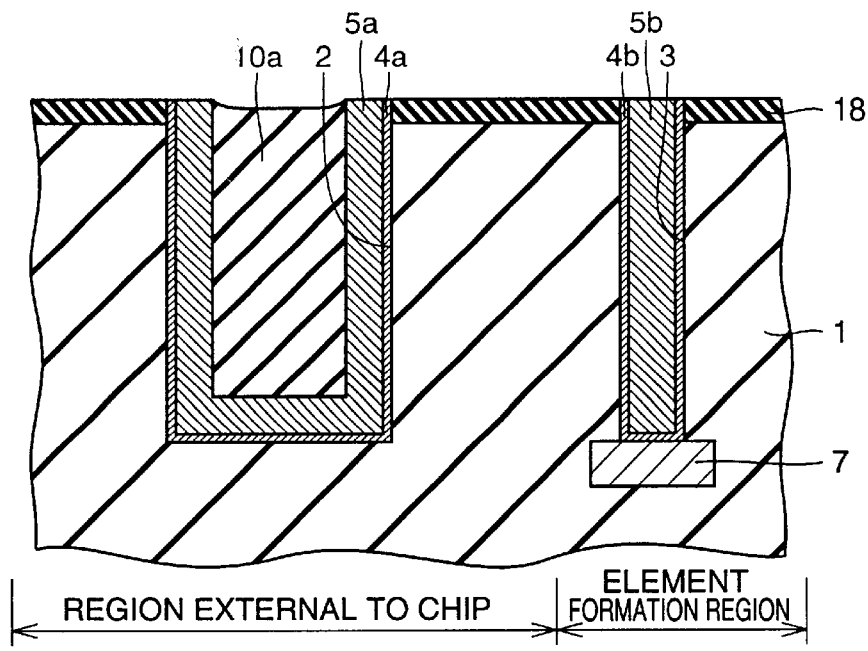
Figure 22:
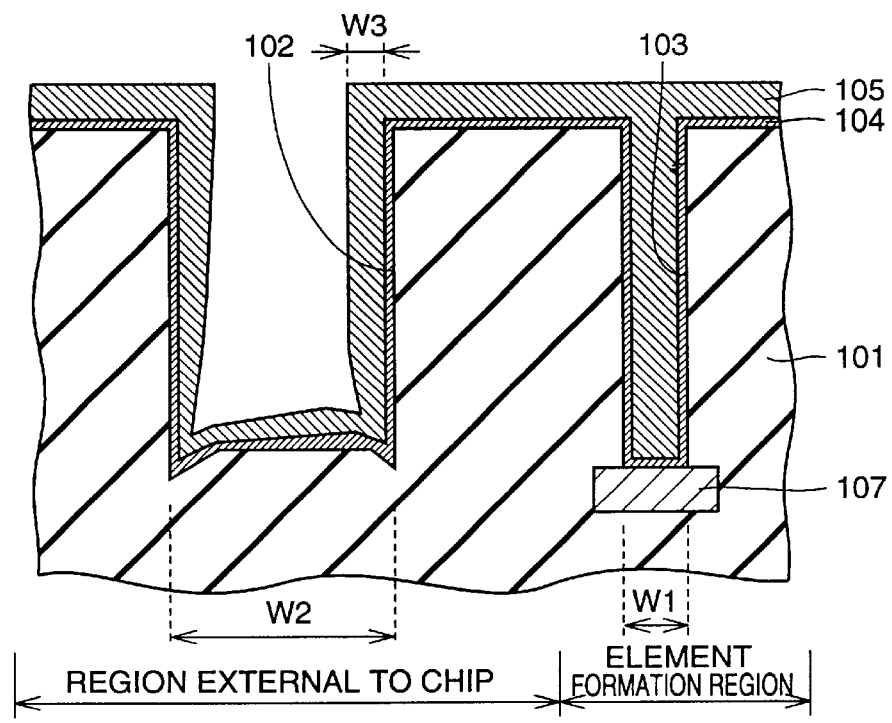
FIGS. 22 and 23 are schematic cross sections for illustrating first and second steps of a method of conventionally manufacturing a semiconductor device.
Figure 23:
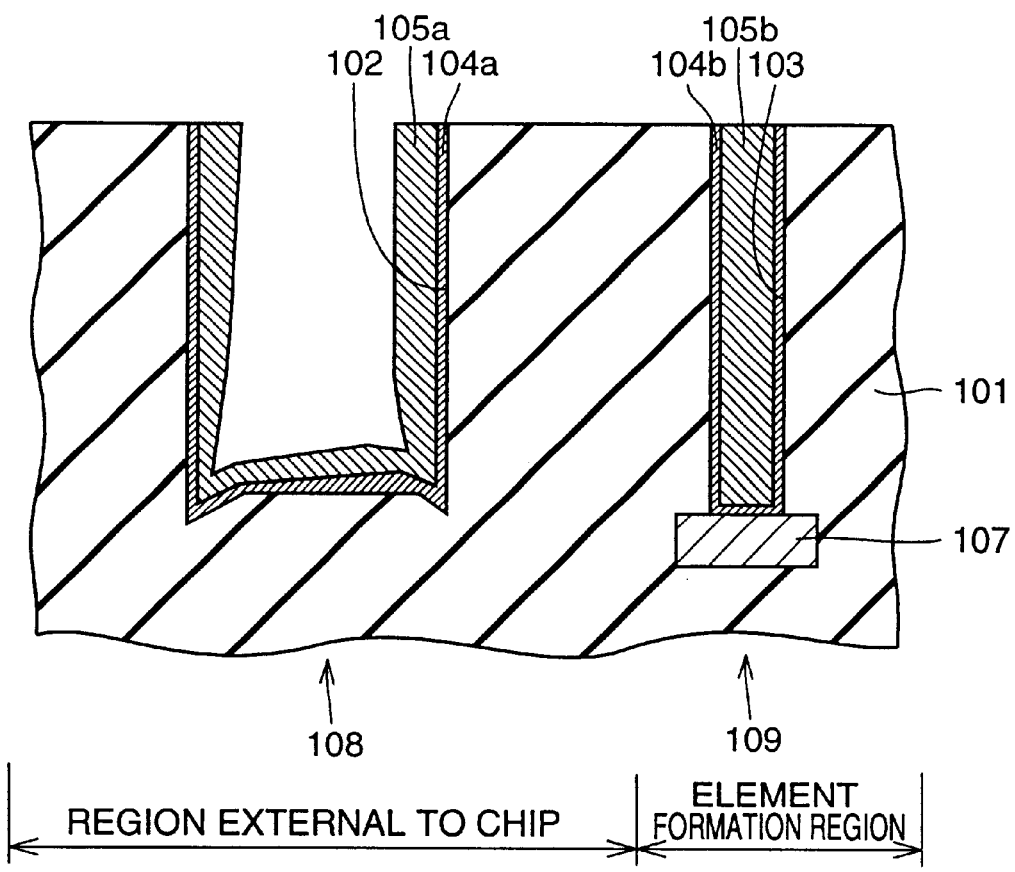
Figure 24:
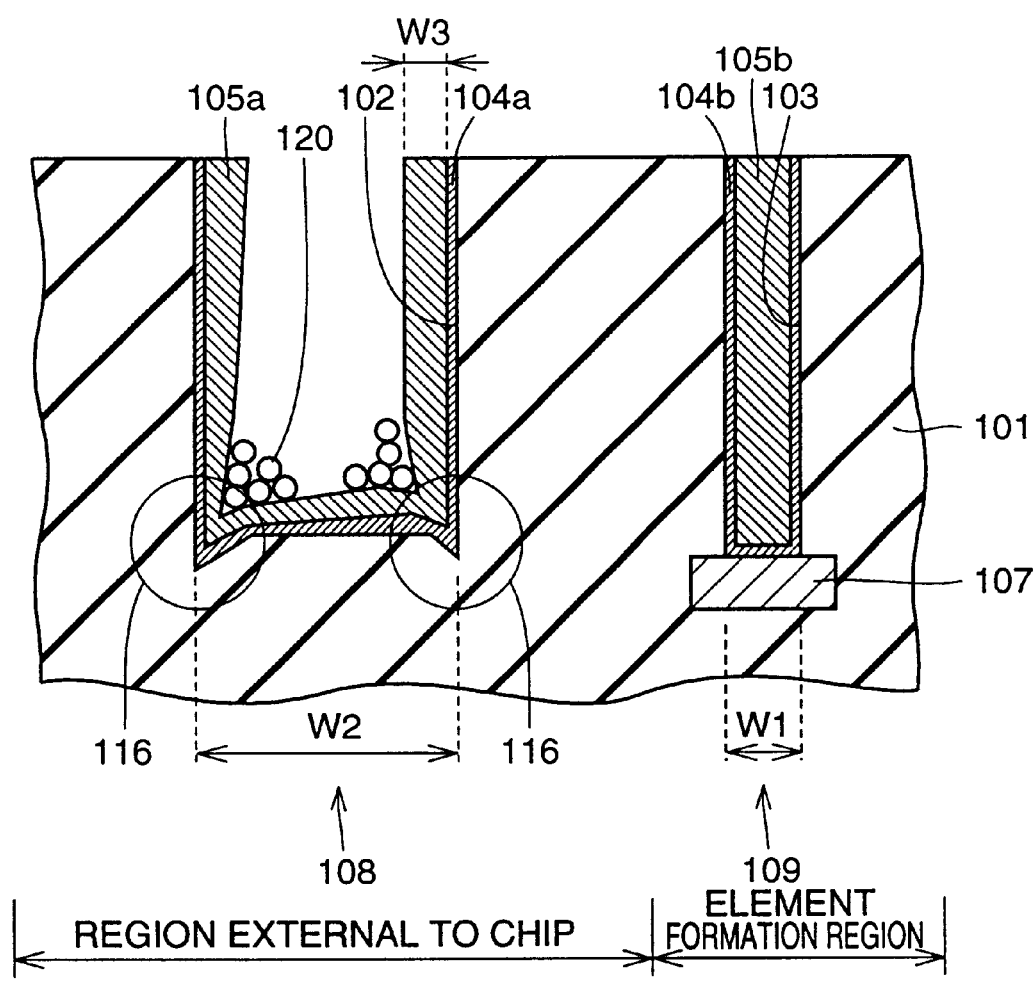
FIG. 24 is a schematic cross section for illustrating a disadvantage of a conventional semiconductor device.
Figure 25:
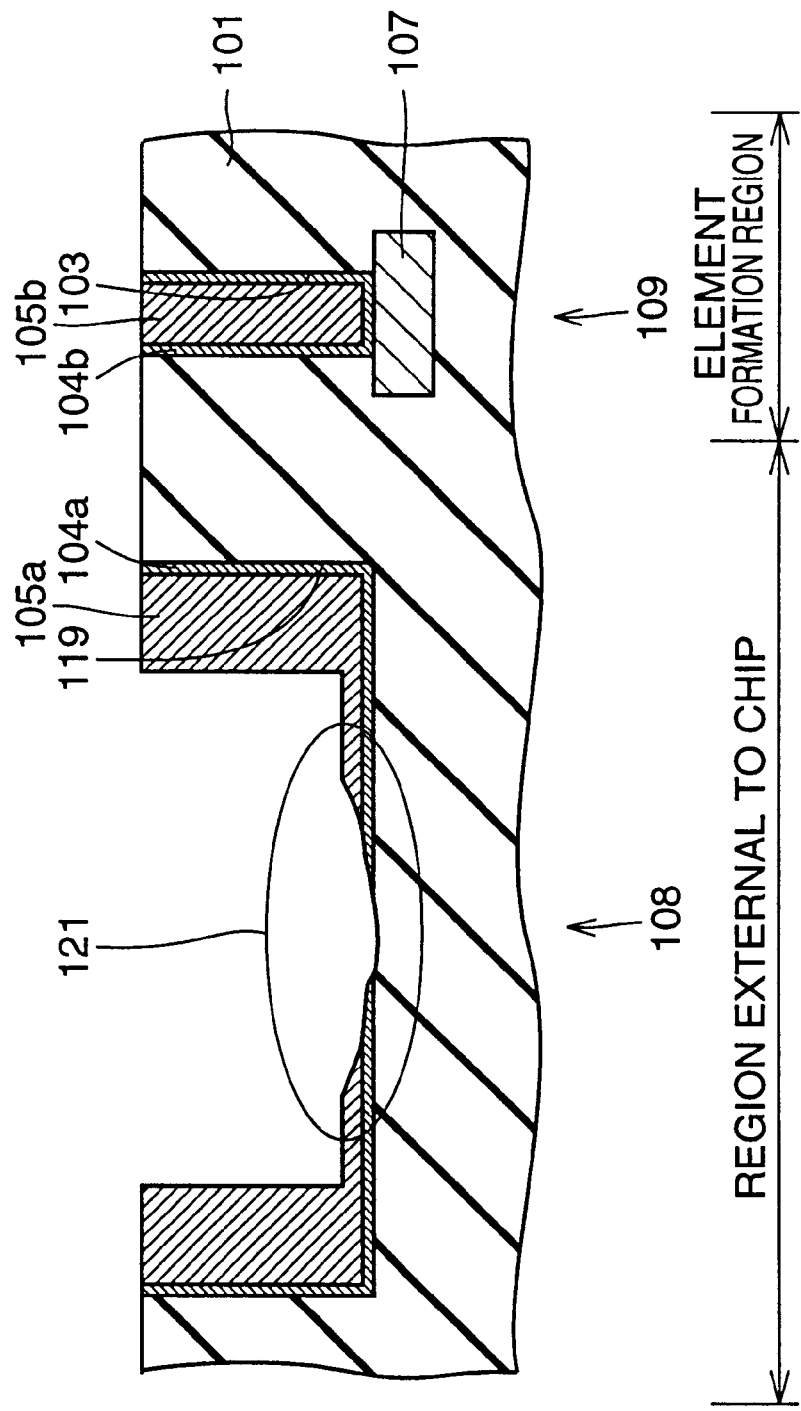
FIGS. 25 and 26 are each a schematic cross section for illustrating another disadvantage of a conventional semiconductor device.
Figure 26:
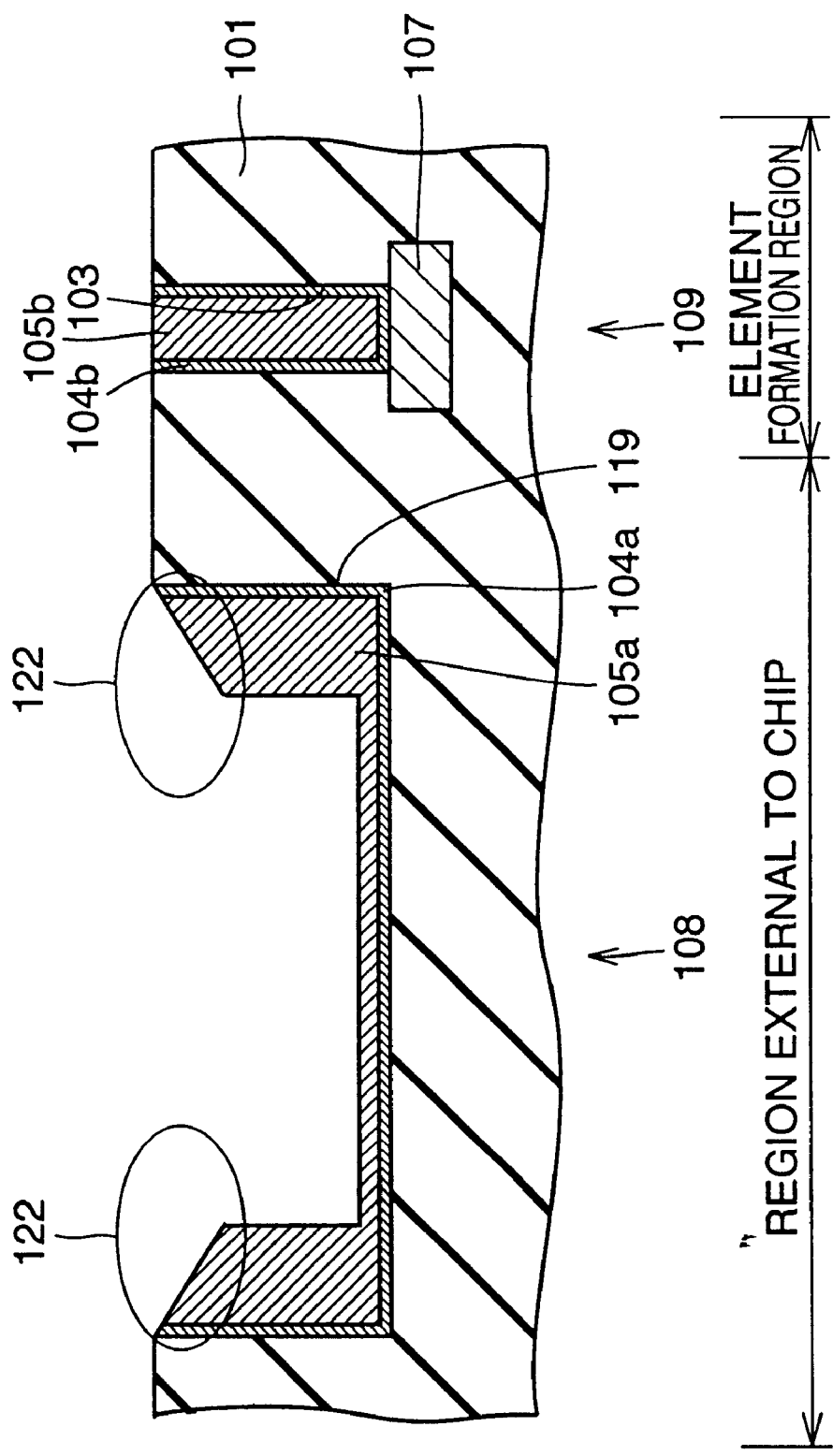

Reference will now be made to FIGS. 20 and 21 to describe a method of manufacturing the FIG. 19 semiconductor device.

Initially on a semiconductor substrate (not shown) in an element formation region an interconnection 7 is provided and thereon interlayer insulating film 1 is provided. On interlayer insulating film 1 is provided overlying interlayer insulating film 18 different in material from interlayer insulating film 1. On overlying interlayer insulating film 18 a resist film is provided and used as a mask to partially, anisotropically etch overlying interlayer insulating film 18 and underlying interlayer insulating film 1 away to form a contact hole 3. Furthermore in a region external to a chip on overlying interlayer insulating film 18 a resist film is provided and used as a mask to partially, anisotropically etch overlying interlayer insulating film 18 and underlying interlayer insulating film 1 away to form a trench 2 for a large pattern. Barrier metal film 4 is provided to extend from an internal portion of trench 2 for a large pattern and that of contact hole 3 to an upper surface of overlying interlayer insulating film 18. On barrier metal film 4 a tungsten film 5 is provided to fill contact hole 3. On tungsten film 5 an SOG film 10 is provided to fill trench 2 for a large pattern. Thus the structure as shown in FIG. 20 is obtained.

Then, SOG film 10, tungsten film 5 and barrier metal film 4 are chemically mechanically polished and thus removed from an upper surface of overlying interlayer insulating film 18. As a result the structure as shown in FIG. 21 is obtained.

Then, as in the second embodiment, an SOG film 10a remaining in trench 2 for a large pattern is removed, for example etched away. If overlying interlayer insulating film 18 is formed of a material that is hardly eroded when SOG film 10a is being etched away and thus removed (a material having an etching rate different than SOG film 10a) then overlying interlayer insulating film 18 can be prevented from having an upper surface otherwise lowered in level while SOG film 10a is being etched away. As a result, trench 2 for a large pattern can be prevented from having an upper portion with tungsten film 5a and barrier metal film 4a partially protruding, as seen from an upper surface of overlying interlayer insulating film 18, when SOG film 10a is etched away and thus removed.

Thus such a semiconductor device as shown in FIG. 19 can be readily obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device including an element formation region arranged on a semiconductor substrate and an external region arranged on said semiconductor substrate and surrounding said element formation region, comprising the steps of:

providing in said external region an interlayer insulating film having a marking recess;

providing a covering film extending from an internal portion of said marking recess to an upper surface of said interlayer insulating film;

providing an insulating filling film located on said covering film and filling at least said marking recess; and with said insulating filling film filling at least said marking recess, chemically mechanically polishing and thus removing said covering film located on said upper surface of said interlayer insulating film.

2. The method according to claim 1, wherein said step of providing said filling film includes providing a resin film in said marking recess.

3. The method according to claim 1, wherein said step of providing said filling film includes filling said marking recess with a spin-on-glass film.

4. The method according to claim 1, wherein:

said step of providing said filling film includes filling said marking recess with an optically opaque film; and said step of removing said covering film is followed by the step of partially removing said optically opaque film from an upper portion of said marking recess.

5. The method according to claim 4, wherein said optically opaque film is a film formed through a spin-on-glass process and being mixed with a dopant to be opaque.

6. The method according to claim 1, wherein said step of providing said filling film includes providing a phosphorus-containing, silicon oxide film in said marking recess.

7. The method according to claim 1, wherein said step of removing said covering film is followed by the step of removing an upper surface layer of said interlayer insulating film to allow said covering film in said marking recess to have a portion protruding as seen from an upper surface of said interlayer insulating film.

8. The method according to claim 1, wherein said step of providing said interlayer insulating film includes the steps of:

providing an underlying interlayer insulating film in said external region;

providing an overlying interlayer insulating film on said underlying interlayer insulating film; and partially removing said overlying and underlying interlayer insulating films to form said marking recess.

9. The method according to claim 1, wherein:

said step of providing said interlayer insulating film includes providing said interlayer insulating film extending to said element formation region;

said step of providing said covering film is provided following the step of providing in said element formation region at said interlayer insulating film a recess smaller in width than said marking recess; and said step of providing said covering film includes filling said recess with said covering film.

10. The method according to claim 1, wherein said marking recess is used to form at least one selected from the group consisting of an alignment mark and a process management pattern.

* * * * *